(12) United States Patent
Ji

(10) Patent No.: US 11,237,767 B2
(45) Date of Patent: Feb. 1, 2022

(54) MEMORY SYSTEM, MEMORY CONTROLLER AND METHOD FOR OPERATING MEMORY CONTROLLER

(71) Applicant: SK hynix Inc., Gyeonggi-do (KR)

(72) Inventor: SeungGu Ji, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/906,640

(22) Filed: Jun. 19, 2020

(65) Prior Publication Data

US 2021/0132863 A1 May 6, 2021

(30) Foreign Application Priority Data

Nov. 5, 2019 (KR) ........................ 10-2019-0140000

(51) Int. Cl.
*G06F 3/06* (2006.01)
*G11C 11/4096* (2006.01)
*G11C 7/22* (2006.01)
*G11C 7/10* (2006.01)
*G06F 13/16* (2006.01)

(52) U.S. Cl.
CPC .......... *G06F 3/0659* (2013.01); *G06F 3/0679* (2013.01); *G06F 13/1673* (2013.01); *G11C 7/1006* (2013.01); *G11C 7/22* (2013.01); *G11C 11/4096* (2013.01)

(58) Field of Classification Search
None
See application file for complete search history.

(56) References Cited

U.S. PATENT DOCUMENTS

| 8,351,256 | B2 * | 1/2013 | Son | G06F 11/1072 |
| | | | | 365/185.03 |
| 8,566,508 | B2 * | 10/2013 | Borchers | G06F 12/0246 |
| | | | | 711/103 |
| 10,114,589 | B2 * | 10/2018 | Ouyang | G11C 16/08 |
| 2014/0369133 | A1 * | 12/2014 | Lee | G11C 16/0483 |
| | | | | 365/185.21 |
| 2020/0301611 | A1 * | 9/2020 | Sia | G06F 3/0659 |

FOREIGN PATENT DOCUMENTS

| KR | 10-0613941 | 8/2006 |
| KR | 10-2016-0131268 | 11/2016 |

* cited by examiner

*Primary Examiner* — Elias Mamo
(74) *Attorney, Agent, or Firm* — IP & T Group LLP

(57) ABSTRACT

A memory system, a memory controller and an operating method are disclosed. By inputting a read command to the memory device, starting to input data for a write command when the write command is input to the memory device while the memory device performs a read sensing operation for the read command, and inputting, to the memory device, data for the write command when input of the write command is started, it is possible to enhance the write performance of the memory system when the memory system executes a write operation after a read operation.

13 Claims, 15 Drawing Sheets

MEMORY SYSTEM, MEMORY CONTROLLER AND METHOD FOR OPERATING MEMORY CONTROLLER

CROSS-REFERENCE TO RELATED APPLICATION

The present application claims priority under 35 U.S.C. § 119(a) to Korean Patent Application No. 10-2019-0140000, filed on Nov. 5, 2019, which is incorporated herein by reference in its entirety.

BACKGROUND

1. Technical Field

Various embodiments generally relate to a memory system, a memory device and a method for operating the memory system.

2. Related Art

A memory system, e.g., a storage device stores data based on a request of a host, such as a computer, a smartphone, a tablet, or any of various other electronic devices. A memory system may be of a type that stores data in a magnetic disk, such as a hard disk drive (HDD), or of a type that stores data in a nonvolatile memory, such as a solid state drive (SDD), a universal flash storage (UFS) device or an embedded MMC (eMMC) device.

The memory system may further include a memory controller for controlling a memory device (e.g., a volatile memory/a nonvolatile memory). The memory controller may receive a command from the host, and may perform or control an operation for reading, writing or erasing data with respect to the memory device in the memory system, based on the received command. The memory controller may drive firmware for performing logical calculations to execute or control these operations.

The memory system may execute an operation of reading specific data from the memory device and then writing other data to the memory device. In general, an operation in which the memory system writes other data to the memory device is performed after the operation in which the memory system reads specific data from the memory device is finished. Therefore, in this case, the host is likely to recognize that the write performance of the memory system is low.

SUMMARY

Various embodiments are directed to a memory system, a memory device and a method for operating the memory system capable of enhancing the write performance of the memory system when the memory system executes a write operation after a read operation.

In one aspect, embodiments of the disclosure may provide a memory system including: a memory device including a plurality of memory blocks; and a memory controller configured to control the memory device.

The memory controller may input a read command to the memory device.

The memory controller may start to input data for a write command when the write command is input to the memory device while the memory device performs a read sensing operation for the read command.

The memory controller may input, to the memory device, data for the write command when input of the write command is started.

The memory controller may suspend the data input for the write command, which is in progress, when the read sensing operation for the read command is finished.

The memory controller may process data for the read command output from the memory device after suspending the data input for the write command.

The memory controller may resume the data input for the write command after the memory device finishes output of the data for the read command.

In another aspect, embodiments of the disclosure may provide a memory device including: a buffer configured to store data input from a memory controller and data to be output to the memory controller.

The memory device may perform data input for a write command when the write command is input from the memory controller while performing a read sensing operation for a read command input from the memory controller.

A data for the write command may be input to the buffer when input of the write command is started.

The memory device may suspend input of data for the write command when the read sensing operation for the read command is finished.

The memory device may process the data output for the read command after suspending the input of data for the write command.

The memory device may output the data for the read command from the buffer.

The memory device may resume input of data for the write command after the data output for the read command is finished.

In still another aspect, embodiments of the disclosure may provide a method for operating a memory system comprising a memory device and a memory controller configured to control the memory device, the method including: inputting a read command to the memory device.

The method for operating the memory system may include starting to input data for a write command when the write command is input to the memory device while the memory device performs a read sensing operation for the read command.

A data for the write command may be input to the memory device when input of the write command is started.

The method for operating the memory system may further include suspending input of data for the write command when the read sensing operation for the read command is finished.

The method for operating the memory system may further include processing the data for the read command output from the memory device after suspending the data input for the write command.

The method for operating the memory system may further include resuming input of the data for the write command after the memory device finishes outputting the data for the read command.

In still another aspect, embodiments of the disclosure may provide an operating method of a memory device including: sensing data stored in a cell array and storing the sensed data in a read buffer while receiving write data in a write buffer through an input/output (I/O) terminal.

The operating method of the memory device may include outputting the sensed data from the read buffer through the I/O terminal while suspending the receiving of the write data.

The operating method of the memory device may include resuming the receiving of the write data through the I/O terminal after the outputting of the sensed data is completed.

The read buffer, the write buffer, the cell array and the I/O terminal may be included in the memory device.

According to the embodiments of the disclosure, it is possible to enhance the write performance provided by the memory system when the memory system executes a write operation after a read operation.

DETAILED DESCRIPTION

Figure 1:
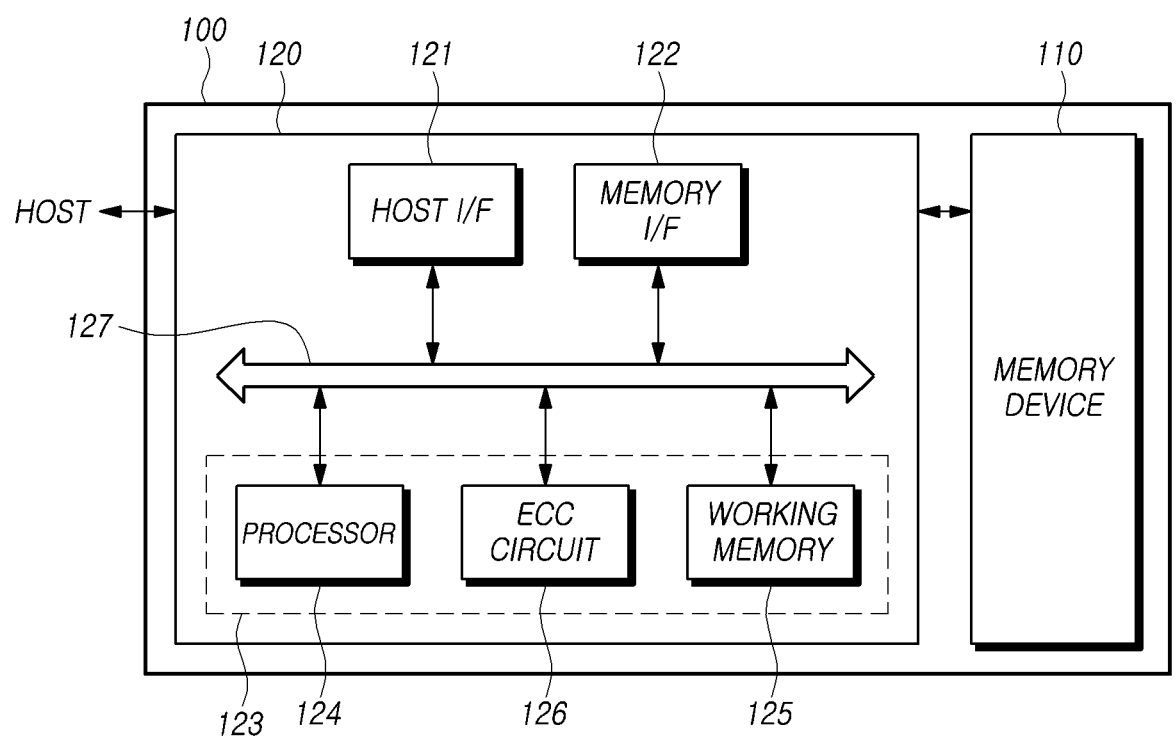
FIG. 1 is a schematic diagram illustrating a configuration of a memory system in accordance with an embodiment of the disclosure.

Hereinafter, various embodiments of the disclosure are described in detail with reference to the accompanying drawings. However, aspects and features of the present invention may be embodied in different ways to form other embodiments, including variations of any of the disclosed embodiments. Thus, the invention is not limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is also noted that reference to "an embodiment," "another embodiment" or the like does not necessarily mean only one embodiment, and different references to any such phrase are not necessarily to the same embodiment(s).

FIG. 1 is a diagram schematically illustrating a memory system 100 in accordance with an embodiment of the disclosure.

Referring to FIG. 1, the memory system 100 may include a memory device 110 which stores data, and a memory controller 120 which controls the memory device 110.

The memory device 110 includes a plurality of memory blocks, and operates in response to the control of the memory controller 120. Operations of the memory device 110 may include, for example, a read operation, a program operation (also referred to as a write operation) and an erase operation.

The memory device 110 may include a memory cell array including a plurality of memory cells (also simply referred to as "cells") which store data. Such a memory cell array may exist in memory blocks.

For example, the memory device 110 may be realized as any of various types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (SU-RAM).

The memory device 110 may be realized in a three-dimensional array structure. The embodiments of the disclosure may be applied to not only a flash memory device in which a charge storage layer is configured by a conductive floating gate but also a charge trap flash (CTF) in which a charge storage layer is configured by a dielectric layer.

The memory device 110 is configured to receive a command, an address and the like from the memory controller 120 and access a region in the memory cell array which is selected by the address. In other words, the memory device 110 may perform an operation corresponding to the command, for a region selected by the address.

For example, the memory device 110 may perform a program operation, a read operation and an erase operation. In the program operation, the memory device 110 may program data to a region selected by the address. In the read operation, the memory device 110 may read data from a region selected by the address. In the erase operation, the memory device 110 may erase data stored in a region selected by the address.

The memory controller 120 may control write (program), read, erase and background operations for the memory device 110. For example, the background operation may include at least one among a garbage collection (GC)

operation, a wear leveling (WL) operation, a bad block management (BBM) operation, and the like.

The memory controller 120 may control the operation of the memory device 110 according to a request of a host. The memory controller 120 may also control the operation of the memory device 110 even in the absence of a request of the host.

The memory controller 120 and the host may be separate devices or may be integrated into one device. The following description is given in the context of that the memory controller 120 and the host are separate devices.

Referring to FIG. 1, the memory controller 120 may include a memory interface 122 and a control circuit 123, and may further include a host interface 121.

The host interface 121 provides an interface for communication with the host.

When receiving a command from the host, the control circuit 123 may receive the command through the host interface 121, and then, may perform an operation of processing the received command.

The memory interface 122 is coupled with the memory device 110 and thereby provides an interface for communication with the memory device 110. That is to say, the memory interface 122 may be configured to provide the interface between the memory device 110 and the memory controller 120 in response to the control of the control circuit 123.

The control circuit 123 performs the general control operations of the memory controller 120, thereby controlling the operations of the memory device 110. To this end, for instance, the control circuit 123 may include at least one of a processor 124 and a working memory 125. In an embodiment, the control circuit 123 may further include an error detection and correction circuit (ECC circuit) 126.

The processor 124 may control general operations of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the received logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 is configured to randomize data received from the host. For example, the processor 124 may randomize data received from the host, by using a randomizing seed. Stored randomized data is provided to the memory device 110 and is programmed to the memory cell array.

The processor 124 is configured to derandomize data received from the memory device 110, in a read operation. For example, the processor 124 may derandomize data received from the memory device 110, by using a derandomizing seed. Derandomized data may be outputted to the host.

The processor 124 may control the operation of the memory controller 120 by executing firmware. In other words, in order to control general operations of the memory controller 120 and perform a logic calculation, the processor 124 may execute (drive) firmware loaded to the working memory 125 upon booting.

The firmware as a program to be executed in the memory system 100 may include various functional layers.

For example, the firmware may include at least one among a flash translation layer (FTL) which performs a translating function between a logical address requested to the memory system 100 from the host and a physical address of the memory device 110, a host interface layer (HIL) which serves to analyze a command requested to the memory system 100 as a storage device from the host and to transfer the analyzed command to the flash translation layer (FTL), a flash interface layer (FIL) which transfers a command instructed from the flash translation layer (FTL) to the memory device 110, and so forth.

For instance, such firmware may be stored in the memory device 110 and then be loaded to the working memory 125.

The working memory 125 may store firmware, program code, a command and data which are necessary to drive the memory controller 120. The working memory 125, for example, as a volatile memory, may include at least one among an SRAM (static RAM), a DRAM (dynamic RAM) and an SDRAM (synchronous DRAM).

The error detection and correction circuit 126 may be configured to detect an error bit by checking target data and correcting the detected error bit, by using an error correction code. Here, the target data may be, for example, data stored in the working memory 125, data read from the memory device 110, or the like.

The error detection and correction circuit 126 may be realized to decode data by using an error correction code. The error detection and correction circuit 126 may be realized by various code decoders. For example, a decoder which performs unsystematic code decoding or a decoder which performs systematic code decoding may be used.

For example, the error detection and correction circuit 126 may detect an error bit for each read data, in the unit of sector. Namely, each read data may be constituted by a plurality of sectors. A sector may mean a data unit smaller than a page as a read unit of a flash memory. Sectors constituting each read data may be matched with one another by an address.

The error detection and correction circuit 126 may calculate a bit error rate (BER), and may determine whether an error is correctable or not, in the unit of sector. For example, in the case where a bit error rate (BER) is higher than a reference value, the error detection and correction circuit 126 may determine that a corresponding sector is uncorrectable or a fail. On the other hand, in the case where a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector in read data is correctable, the error detection and correction circuit 126 may omit an error detection and correction operation for a corresponding sector for next read data. If the error detection and correction operation for all read data is done in this way, the error detection and correction circuit 126 may detect a sector which is determined to be uncorrectable to the last. There may be one or more sectors that are determined to be uncorrectable. The error detection and correction circuit 126 may transfer information (for example, address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the likes, a data bus for transferring various data, and the like.

The above-described components 121, 122, 124, 125 and 126 of the memory controller 120 are exemplary only. Two or more of these components (or the functionalities thereof) may be integrated into a single component. In some configurations, one or more of the illustrated components may be omitted, while in other configurations one or more other components not shown may be included.

The memory device 110 is described in further detail below with reference to FIG. 2.

Figure 2:
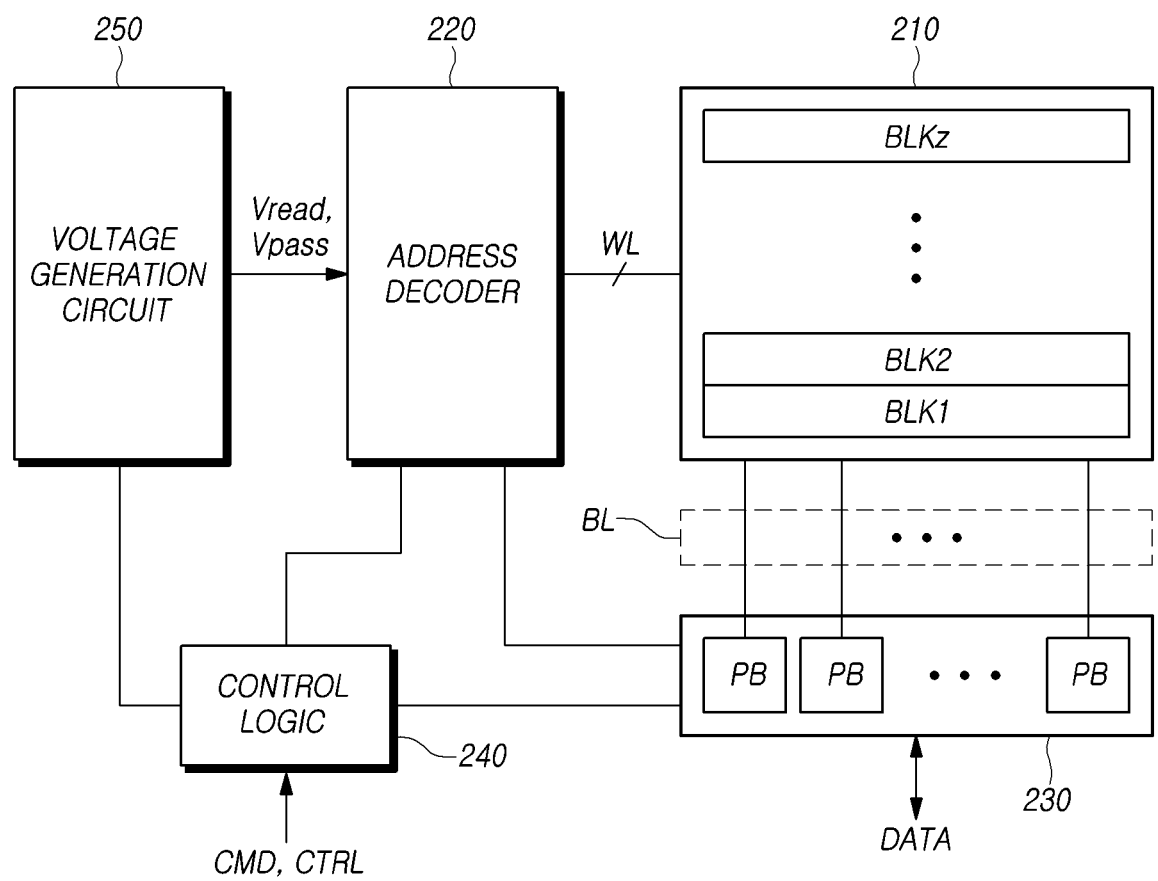
FIG. 2 is a block diagram schematically illustrating a memory device in accordance with an embodiment of the disclosure.

FIG. 2 is a block diagram schematically illustrating the memory device 110 in accordance with an embodiment of the disclosure.

Referring to FIG. 2, the memory device 110 may include a memory cell array 210, an address decoder 220, a read and write circuit 230, control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells which have vertical channel structures.

The memory cell array 210 may be configured by a memory cell array of a two-dimensional structure, or may be configured by a memory cell array of a three-dimensional structure.

Each of the plurality of memory cells included in the memory cell array 210 may store at least 1 bit of data. For instance, each of the plurality of memory cells in the memory cell array 210 may be a single level cell (SLC) which stores 1 bit of data, a multi-level cell (MLC) which stores 2 bits of data, a triple level cell (TLC) which stores 3 bits of data, a quad level cell (QLC) which stores 4 bits of data, or an even higher level cell which stores 5 or more bits of data.

Referring to FIG. 2, the address decoder 220, the read and writhe circuit 230, the control logic 240 and the voltage generation circuit 250 may collectively operate as a peripheral circuit which drive the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory device 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory device 110 may be performed in the unit of page. An address received when a read operation or a program operation is requested may include at least one among a block address, a row address and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which are used in data processing. In another embodiment, the read and write circuit 230 may further include cache buffers for use in a caching function.

The plurality of page buffers PB may be coupled to the memory cell array 210 through the plurality of bit lines BL. The plurality of page buffers PB may continuously or regularly supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. In an embodiment, the read and write circuit 230 may include a column select circuit and so forth in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Figure 3:
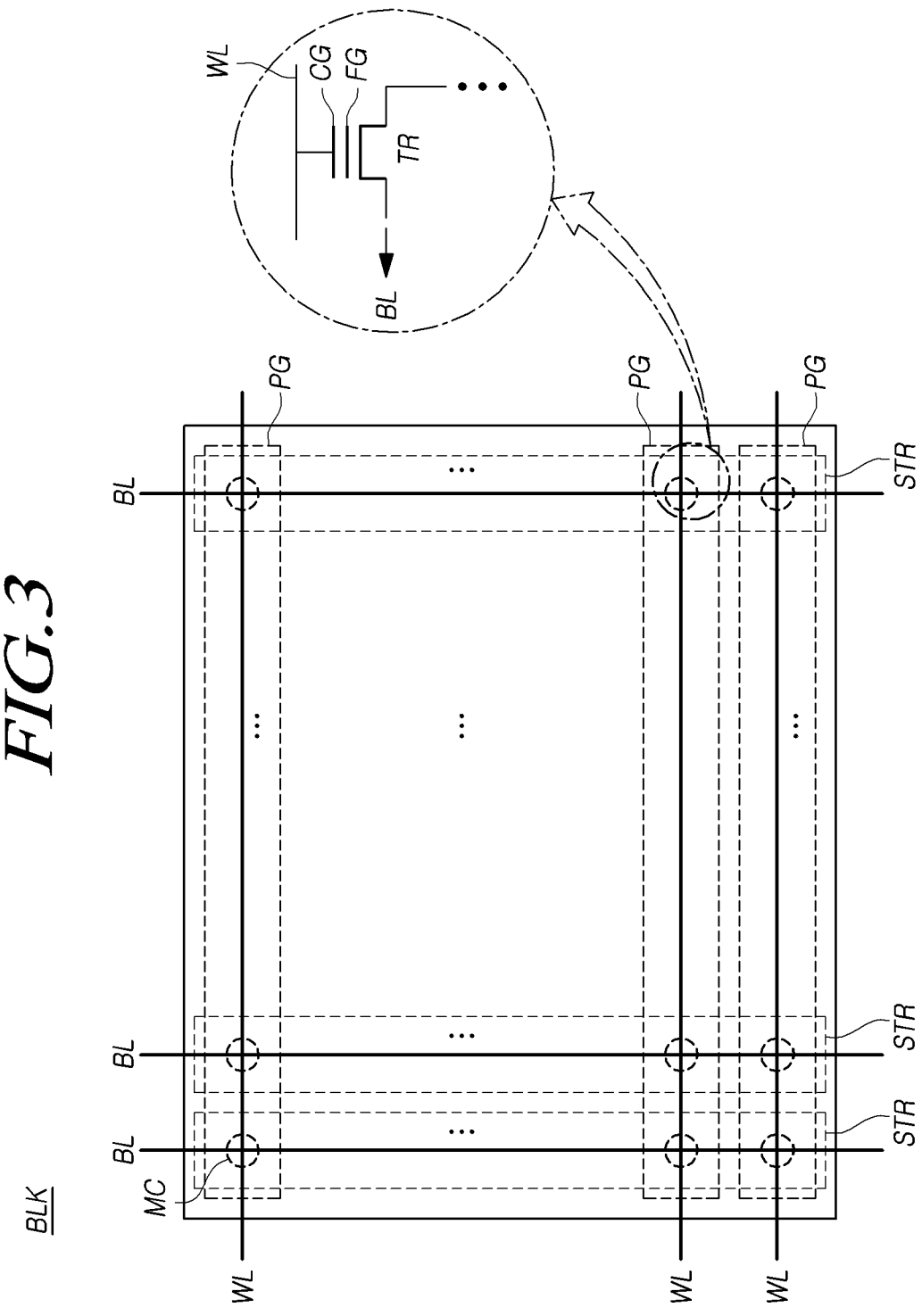
FIG. 3 is a diagram schematically illustrating a representative memory block of the memory device in accordance with an embodiment of the disclosure.

FIG. 3 is a diagram schematically illustrating a representative memory block BLK of the memory device 110 in accordance with an embodiment of the disclosure.

Referring to FIG. 3, the memory block BLK may be configured, for example, as a plurality of pages PG and a plurality of strings STR disposed in directions intersecting with each other.

The plurality of pages PG correspond to a plurality of word lines WL, and the plurality of strings STR correspond to a plurality of bit lines BL.

In the memory block BLK, the plurality of word lines WL and the plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A plurality of memory cells MC may be defined at the respective intersections of the word lines WL and the bit lines BL. A transistor TR may be disposed in each memory cell MC.

For example, the transistor TR may include a drain, a source and a gate. The drain (or source) of the transistor TR may be coupled with a corresponding bit line BL directly or via another transistor TR. The source (or drain) of the transistor TR may be coupled with a source line (which may be the ground) directly or via another transistor TR. The gate of the transistor TR may include a floating gate FG which is surrounded by a dielectric and a control gate CG to which a gate voltage is applied from a word line WL.

In each of the plurality of memory blocks BLK1 to BLKz, a first select line (also referred to as a source select line or a drain select line) may be additionally disposed outside a first outermost word line more adjacent to the read and write circuit 230, and a second select line (also referred to as a drain select line or a source select line) may be additionally disposed outside a second outermost word line.

At least one dummy word line may be disposed between the first outermost word line and the first select line. At least one dummy word line may also be disposed between the second outermost word line and the second select line.

When the memory device 110 has a memory block structure illustrated in FIG. 3, a read operation and a program operation (write operation) may be performed in the unit of page, and an erase operation may be performed in the unit of memory block.

Figure 4:
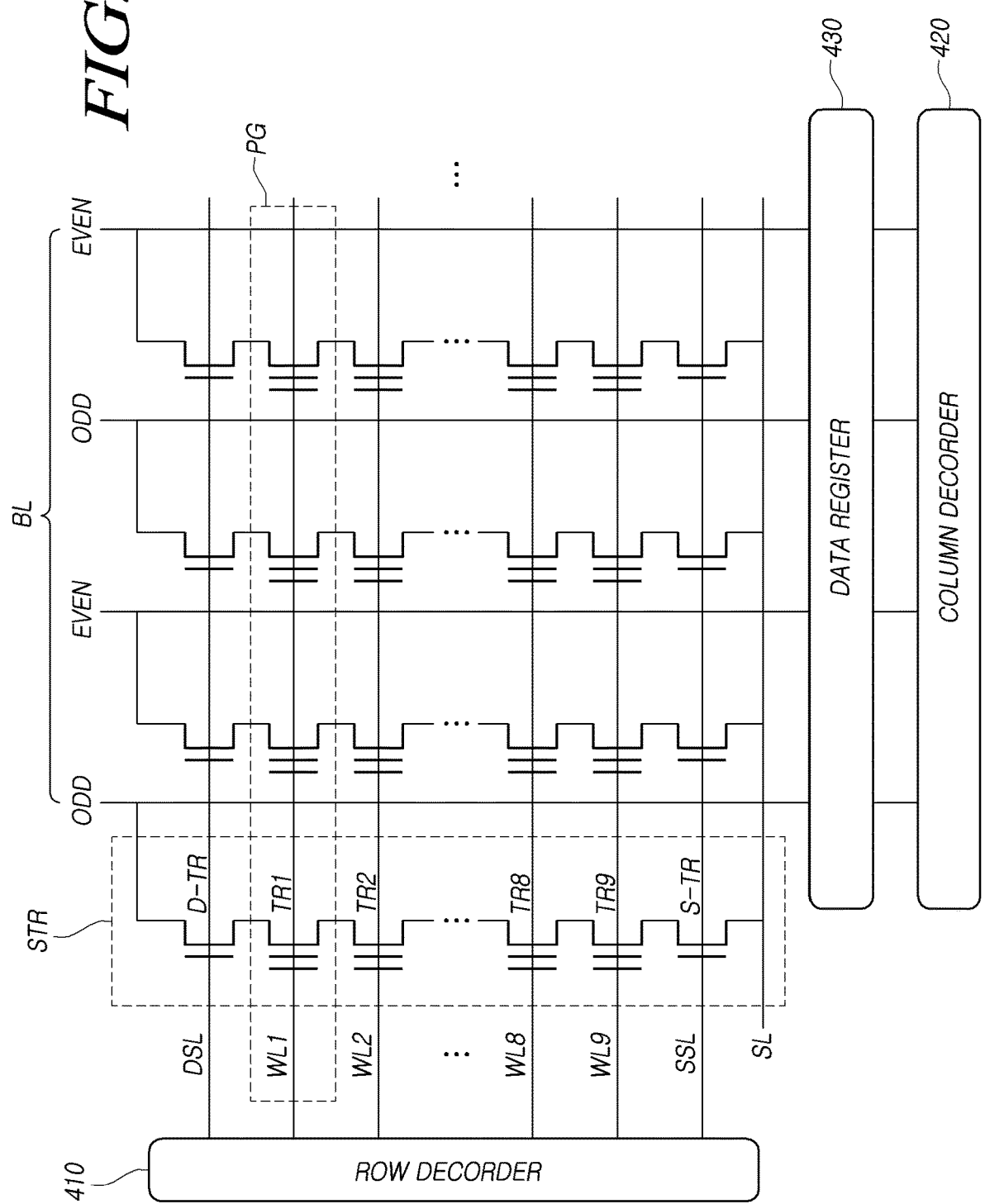
FIG. 4 is a diagram illustrating a structure of word lines and bit lines of the memory device in accordance with an embodiment of the disclosure.

FIG. 4 is a diagram illustrating a structure of word lines WL and bit lines BL of the memory device 110 in accordance with an embodiment of the disclosure.

Referring to FIG. 4, in the memory device 110, there is a core area in which memory cells MC are gathered and a separate auxiliary area which supports the operation of the memory cell array 210.

The core area may be configured by pages PG and strings STR. In such a core area, a plurality of word lines WL1 to WL9 and a plurality of bit lines BL are disposed to intersect with each other.

The plurality of word lines WL1 to WL9 may be coupled with a row decoder 410, and the plurality of bit lines BL may be coupled with a column decoder 420. A data register 430 corresponding to the read and write circuit 230 may exist between the plurality of bit lines BL and the column decoder 420.

The plurality of word lines WL1 to WL9 correspond to a plurality of pages PG.

For example, as illustrated in FIG. 4, each of the plurality of word lines WL1 to WL9 may correspond to one page PG. In contrast, when the size of each of the plurality of word lines WL1 to WL9 is large, each of the plurality of word lines WL1 to WL9 may correspond to at least two (for example, two or four) pages PG. Page PG is a minimum unit in performing a program operation and a read operation. In the program operation and the read operation, all memory cells MC in the same page PG may simultaneously perform the corresponding operations.

The plurality of bit lines BL may be coupled with the column decoder 420 while being identified as odd-numbered bit lines BL and even-numbered bit lines BL.

In order to access memory cells MC, first, an address may be entered into the core area through the row decoder 410 and the column decoder 420 via an input/output terminal to designate target memory cells. Designating target memory cells means accessing memory cells MC positioned at sites where the word lines WL1 to WL9 coupled with the row decoder 410 and the bit lines BL coupled with the column decoder 420 intersect with each other, to program data to the memory cells MC or read out programmed data from the memory cells MC.

A page PG in a first direction (e.g., an X-axis direction) is coupled by a common line which is referred to as a word line WL, and a string STR in a second direction (e.g., a Y-axis direction) is coupled by a common line which is referred to as a bit line BL. Being coupled in common means that corresponding memory cells MC are structurally coupled with one another by the same material and the same voltage is simultaneously applied to the memory cells MC when a voltage is applied thereto. Of course, as a memory cell MC which is coupled in series and is positioned at an intermediate position or a last position is influenced by a voltage drop in a preceding memory cell MC, voltages applied to a first memory cell MC and a last memory cell MC may be slightly different from each other.

Since data is programmed and read via the data register 430 in all data processing operations of the memory device 110, the data register 430 plays a role in processing time. If data processing of the data register 430 is delayed, all the other areas need to wait until the data register 430 finishes the data processing. Also, if the performance of the data register 430 is degraded, the overall performance of the memory device 110 may be degraded.

Referring to the illustration of FIG. 4, in one string STR, a plurality of transistors TR1 to TR9 which are coupled with the plurality of word lines WL1 to WL9 may exist. Areas where the plurality of transistors TR1 to TR9 exist correspond to memory cells MC. The plurality of transistors TR1 to TR9 are transistors each of which includes a control gate CG and a floating gate FG as described above.

The plurality of word lines WL1 to WL9 include two outermost word lines WL1 and WL9. A first select line DSL may be disposed outside a first outermost word line WL1 which is more adjacent to the data register 430 in terms of signal path, and a second select line SSL may be disposed outside a second outermost word line WL9.

A first select transistor D-TR which is on-off controlled by the first select line DSL has only a gate electrode coupled with the first select line DSL and does not include a floating gate FG. A second select transistor S-TR which is on-off controlled by the second select line SSL has only a gate electrode coupled with the second select line SSL and does not include a floating gate FG.

The first select transistor D-TR serves as a switch which turns on or off the coupling between a corresponding string STR and the data register 430. The second select transistor S-TR serves as a switch which turns on or off the coupling between the corresponding string STR and a source line SL. That is to say, the first select transistor D-TR and the second select transistor S-TR are positioned at respective opposite ends of the corresponding string STR, and serve as gate-keepers which couple and decouple signals.

In a program operation, because it is necessary to fill electrons in a target memory cell MC of a bit line BL which is to be programmed, the memory system 100 turns on the first select transistor D-TR by applying a turn-on voltage Vcc to the gate electrode of the first select transistor D-TR, and turns off the second select transistor S-TR by applying a turn-off voltage (e.g., 0V) to the gate electrode of the second select transistor S-TR.

In a read operation or a verify operation, the memory system 100 turns on both the first select transistor D-TR and the second select transistor S-TR. Accordingly, since current may be discharged to the source line SL corresponding to the ground through the corresponding string STR, a voltage level of the bit line BL may be measured. However, in the read operation, there may be a time difference between on-off timings of the first select transistor D-TR and the second select transistor S-TR.

In an erase operation, the memory system 100 may supply a predetermined voltage (e.g., +20V) to a substrate through the source line SL. In the erase operation, the memory system 100 floats both the first select transistor D-TR and the second select transistor S-TR, thereby providing infinite resistance. Accordingly, the memory system 100 is structured such that the first select transistor D-TR and the second select transistor S-TR do not function and electrons may operate due to a potential difference only between a floating gate FG and the substrate.

Figure 5:
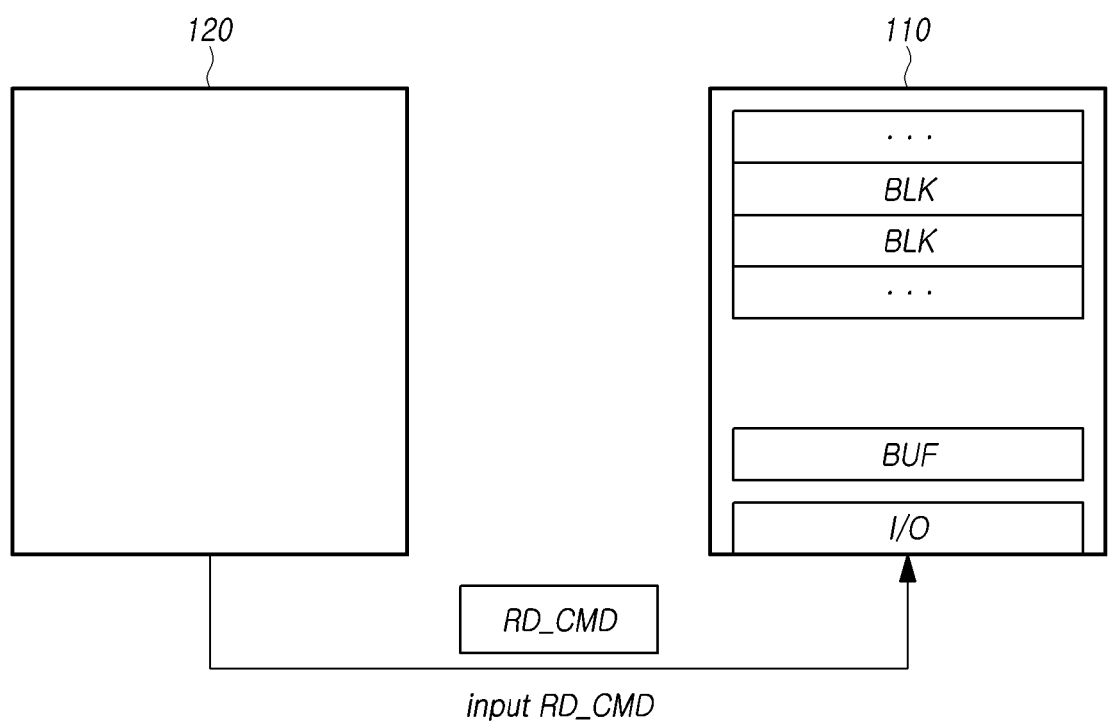
FIG. 5 is a schematic diagram illustrating an operation in which a memory controller inputs a read command RD_CMD in accordance with an embodiment of the disclosure.

FIG. 5 is a schematic diagram illustrating an operation in which the memory controller inputs a read command RD_CMD in accordance with an embodiment of the disclosure.

Referring to FIG. 5, the memory controller 120 may input a read command RD_CMD to the memory device 110. The memory device 110 includes the plurality of memory blocks BLK, a buffer BUF and a data input/output terminal I/O.

The buffer BUF may store data input from the memory controller 120 and data output to the memory controller 120.

In this case, the buffer BUF may be implemented as SRAM, DRAM, or SDRAM included in the memory device 110. The buffer BUF may be a page buffer, a cache, or the like, but it is not limited thereto.

The data input/output terminal I/O may be used as a terminal for outputting data from the memory device 110 or a terminal for inputting data to the memory device 110. However, the data input and the data output may not be executed simultaneously at the data input/output terminal I/O.

Figure 6:
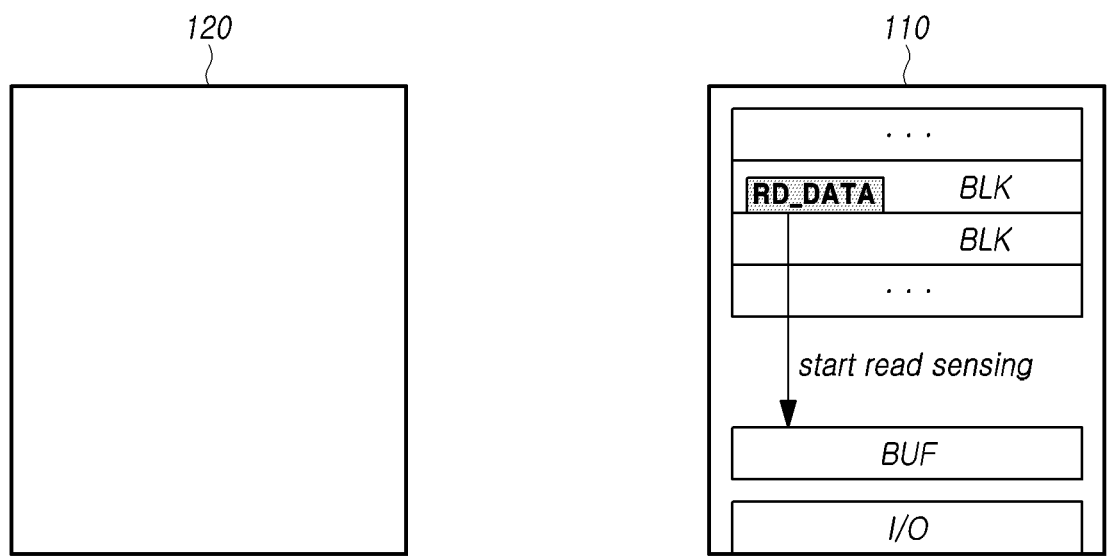
FIG. 6 is a schematic diagram illustrating an operation in which a memory device starts read sensing for the read command RD_CMD in accordance with an embodiment of the disclosure.

FIG. 6 is a schematic diagram illustrating an operation in which the memory device starts read sensing for the read command RD_CMD in accordance with an embodiment of the disclosure.

Referring to FIG. 6, When the memory controller 120 inputs the read command RD_CMD to the memory device 110, the memory device 110 first executes a read sensing operation, which reads data RD_DATA for the read command RD_CMD from the plurality of memory blocks BLK and senses the data to the buffer BUF. The data RD_DATA for the read command RD_CMD means data requested to be read by the read command. Sensing the data to the buffer BUF means loading (storing) the data to the buffer.

After the read sensing operation is finished, the memory device 110 may execute a data output for outputting the sensed (loaded) data in the buffer BUF from the memory device 110 to an external device. That is, the memory device 110 may output the data RD_DATA for the read command RD_CMD when the data output is started.

The memory device 110 may output the sensed (loaded) data from the buffer BUF externally with respect to the memory device 110 through the data input/output terminal I/O. The memory controller 120 may process the data output from the memory device 110. Therefore, after the memory device 110 finishes the data output operation, the memory controller 120 may read data RD_DATA for the read command from the memory device 110.

In other words, the memory device 110 may execute the data output operation after it finishes the read sensing operation, and the memory controller 120 may read the data RD_DATA for the read command RD_CMD from the memory device 110 after the memory device finishes the data output operation by receiving data outputted by the memory device 110.

Generally, the memory controller 120 may start the write operation after the memory device 110 finishes the data output operation when performing the write operation after the read operation.

However, in embodiments of the disclosure, the memory controller 120 may start the write operation before the memory device 110 finishes the data output operation. This is described in detail below.

Figure 7:
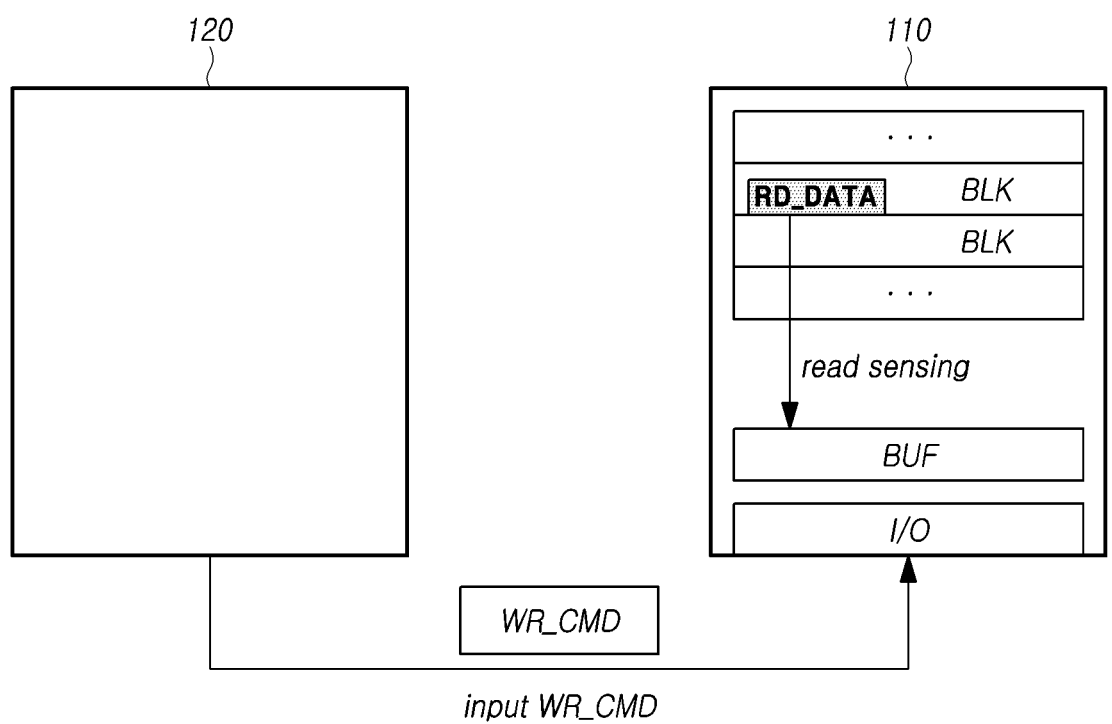
FIG. 7 is a schematic diagram illustrating an operation in which a memory controller inputs a write command WR_CMD in accordance with an embodiment of the disclosure.

FIG. 7 is a schematic diagram illustrating an operation in which the memory controller inputs a write command WR_CMD in accordance with an embodiment of the disclosure.

Referring to FIG. 7, the memory controller 120 may input the write command WR_CMD while the memory device 110 performs the read sensing operation for the data RD_DATA for the read command RD_CMD.

When the write command WR_CMD is input to the memory device 110, the memory controller 120 may start the data input for the write command WR_CMD. When the data input for the write command WR_CMD is started, the memory controller 120 may input data for the write command WR_CMD to the memory device 110.

Figure 8:
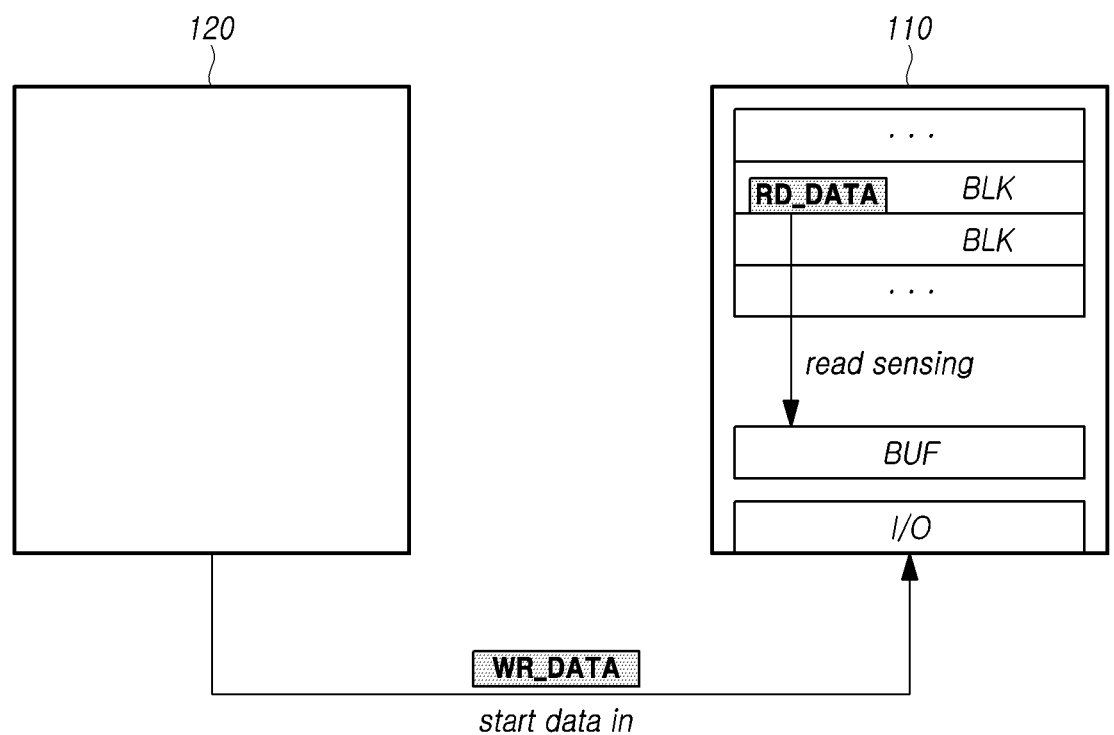
FIG. 8 is a diagram illustrating an operation in which the memory controller starts data input for the write command WR_CMD in accordance with an embodiment of the disclosure.

FIG. 8 is a diagram illustrating an operation in which the memory controller starts the data input for the write command WR_CMD in accordance with an embodiment of the disclosure.

Referring to FIG. 8, the memory controller 120 may start the data input on data WR_DATA for the write command WR_CMD. The data WR_DATA for the write command WR_CMD may be data requested to be written by the write command WR_CMD. In this case, the data WR_DATA for the write command WR_CMD is stored in the buffer BUF.

The memory device 110 may store the data WR_DATA for the write command WR_CMD in the buffer BUF while sensing (loading) the data RD_DATA for the read command RD_CMD to the buffer BUF.

The memory controller 120 starts inputting data WR_DATA for the write command WR_CMD while the memory device 110 processes the read sensing operation for the read command RD_CMD. Therefore, the time at which the write command WR_CMD is processed may be advanced. The performance of the write operation of the memory system 100 may be improved.

In the memory device 110 the buffer BUF may be partitioned or divided into an area in which the data RD_DATA for the read command RD_CMD may be stored and an area in which the data WR_DATA for the write command WR_CMD may be stored.

For example, the area for the read data RD_DATA and the area for the write data WR_DATA may be set. The size of each area may be fixed. For example, the area for the data RD_DATA may be 200 KB, and the area for the data WR_DATA may be 300 KB.

As another example, the memory device 110 may dynamically change the sizes of the area for the data RD_DATA and the area for the data WR_DATA. If the size of the data RD_DATA for the read command RD_CMD increases, the memory device 110 may increase the size of the area for the data RD_DATA. On the other hand, if the size of the data WR_DATA increases, the memory device 110 may increase the size of the area for the data WR_DATA.

The memory device 110 does not occupy the data input/output terminal I/O when the read sensing operation is performed. In other words, the memory device 110 may use the data input/output terminal I/O to store the data WR_DATA for the write command WR_CMD in the buffer BUF when the read sensing operation is performed. Therefore, the memory device 110 may store the data WR_DATA for the write command WR_CMD in the buffer BUF while sensing (loading) the data RD_DATA for the read command RD_CMD to the buffer BUF.

However, when the memory device 110 finishes the read sensing operation on the data RD_DATA for the read command RD_CMD, the memory device 110 may occupy the data input/output terminal I/O in order to output the data RD_DATA for the read command RD_CMD stored in the buffer BUF.

If the data input/output terminal I/O is simultaneously occupied by the operations of outputting the data RD_DATA for the read command RD_CMD stored in the buffer BUF and the storing the data WR_DATA for the write command WR_CMD in the buffer BUF, a collision may occur.

Operations of the memory controller 120 and the memory device 110 to prevent such collision are described below.

Figure 9:
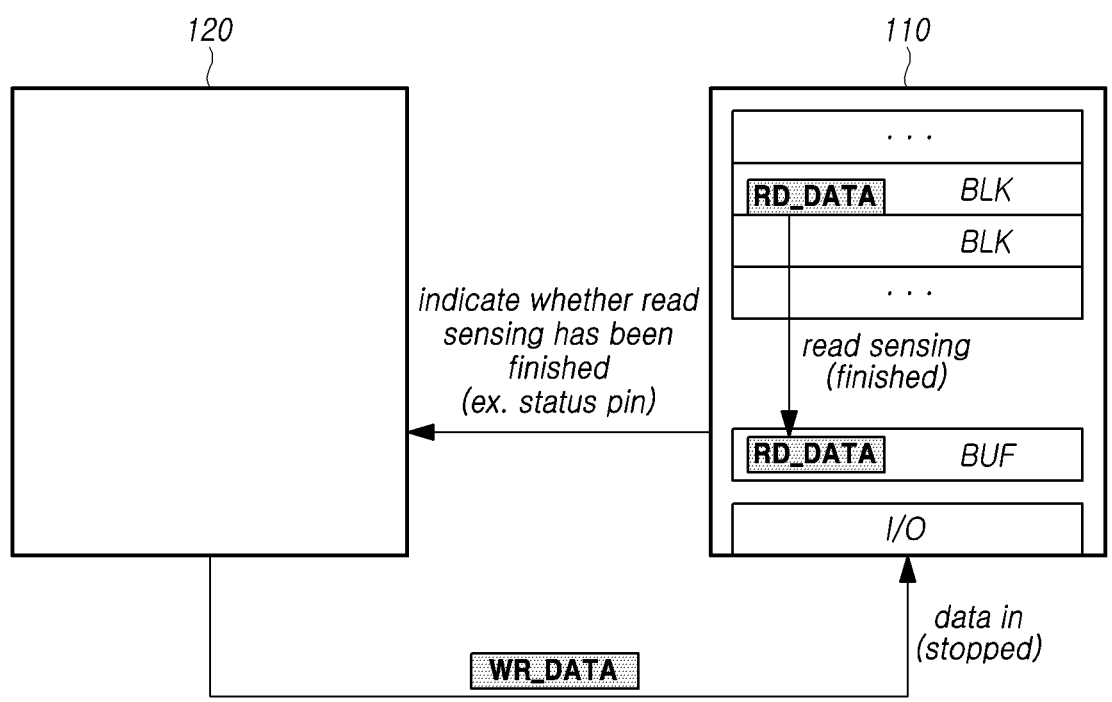
FIG. 9 is a diagram illustrating an operation in which a memory controller suspends inputting data for the write command WR_CMD in accordance with an embodiment of the disclosure.

FIG. 9 is a diagram illustrating an operation in which the memory controller suspends inputting the data WR_DATA for the write command WR_CMD in accordance with an embodiment of the disclosure.

Referring to FIG. 9, the memory device 110 may finish the read sensing operation on the data RD_DATA for the read command RD_CMD.

In this case, the memory device 110 may indicate to the memory controller 120 whether the read sensing operation on the data RD_DATA for the read command RD_CMD has finished.

For example, the memory device 110 may the memory device 110 may communicate with the memory controller 120 through a terminal (e.g. status pin) to indicate whether the memory device 110 is in a state in which the read sensing operation is finished. When the voltage level of the terminal changes from a first level to a second level, the memory controller 120 determines that the read sensing operation on the data RD_DATA for the read command RD_CMD is finished.

When the memory controller 120 recognizes that the memory device 110 has finished the read sensing operation on the data RD_DATA for the read command RD_CMD, it suspends the operation of inputting the data WR_DATA for the write command WR_CMD to the memory device 110.

The memory controller 120 may suspend the operation of writing the data WR_DATA for the write command WR_CMD in order to first finish the operation of reading the data RD_DATA for the read command RD_CMD.

When the memory controller 120 suspends inputting the data WR_DATA for the write command WR_CMD to the memory device 110, the memory device 110 may occupy the data input/output terminal I/O in order to output the data RD_DATA for the read command RD_CMD stored in the buffer BUF.

Figure 10:
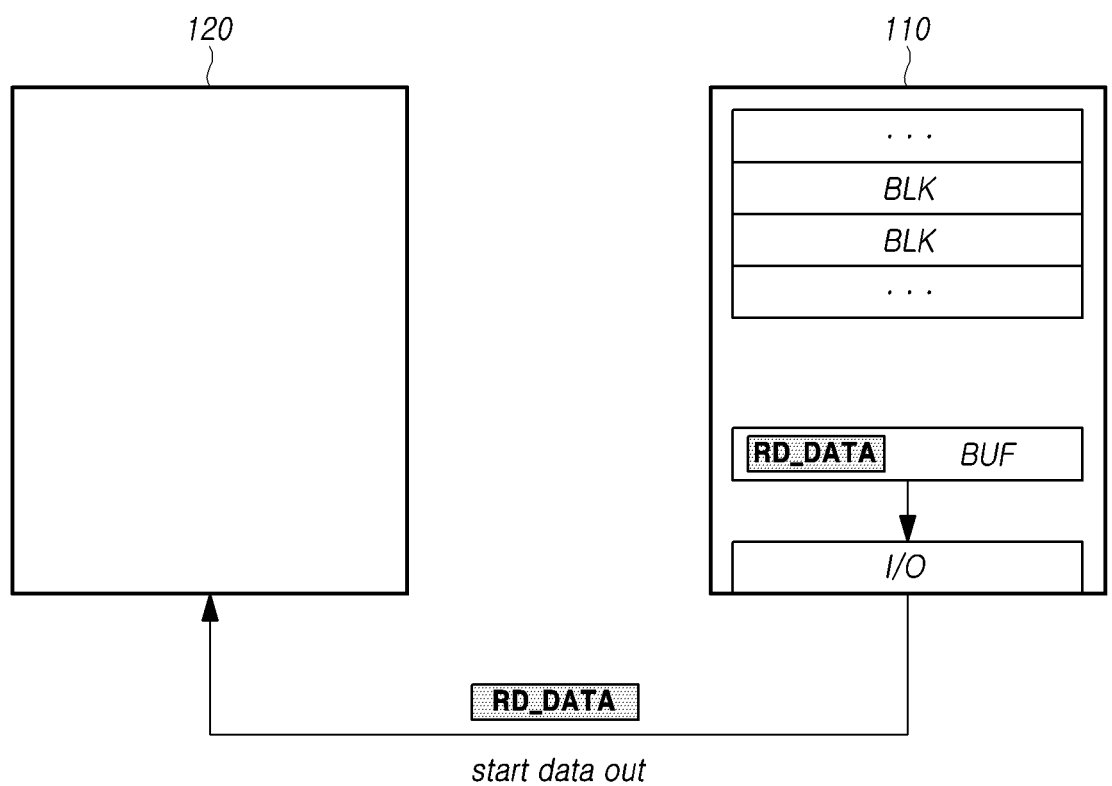
FIG. 10 is a diagram illustrating an operation in which a memory device starts data output for the read command RD_CMD in accordance with an embodiment of the present disclosure.

FIG. 10 is a diagram illustrating an operation in which the memory device starts the data output for the read command RD_CMD in accordance with an embodiment of the present disclosure.

Referring to FIG. 10, after the memory controller 120 suspends inputting the data WR_DATA for the write command WR_CMD, that is, the operation of inputting the data WR_DATA for the write command WR_CMD to the memory device 110, the memory device 110 may output the data RD_DATA for the read command RD_CMD to the memory controller 120.

The memory controller 120 may process the data RD_DATA for the read command RD_CMD output from the memory device 110. The memory controller 120 reads the data RD_DATA for the read command RD_CMD from the memory device 110 and then either stores it or sends it to the host. When the data output for the read command RD_CMD is started, the data RD_READ for the read command RD_CMD may be output from the buffer BUF.

Figure 11:
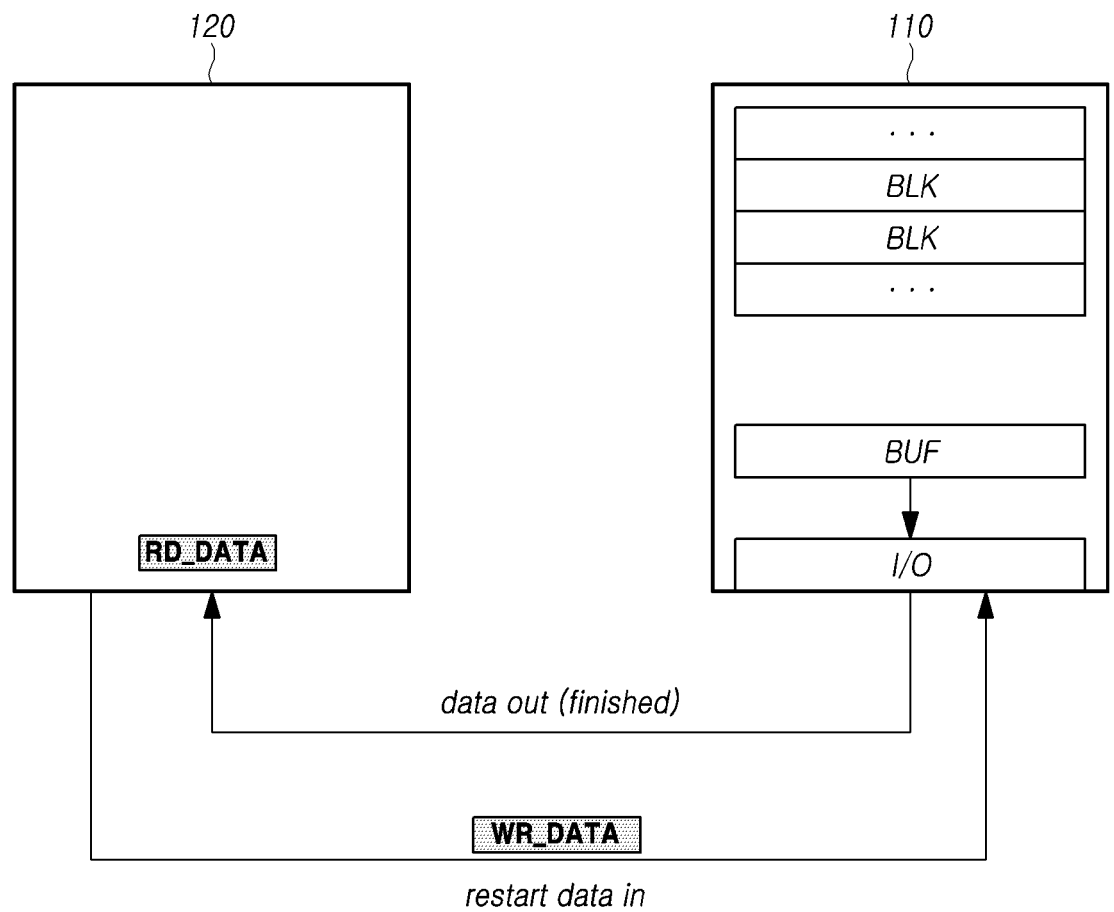
FIG. 11 is a diagram illustrating an operation in which a memory controller resumes data input for the write command WR_CMD in accordance with an embodiment of the present disclosure.

FIG. 11 is a diagram illustrating an operation in which the memory controller resumes the data input for the write command WR_CMD in accordance with an embodiment of the present disclosure.

Referring to FIG. 11, the memory device 110 may finish the operation of outputting the data RD_DATA for the read command RD_CMD to the memory controller 120.

When the memory device 110 finishes the operation of outputting the data RD_DATA for the read command RD_CMD, the memory controller 120 resumes the previously suspended data input for the write command WR_CMD.

In this case, the memory controller 120 may input only the remaining data that has not yet been stored in the buffer BUF among all of the data WR_DATA for the write command WR_CMD. Otherwise, the advantage of shortening the write operation time by previously inputting some of the data WR_DATA for the write command WR_CMD to the memory device 110 is lost if the memory controller 120 inputs all of the data WR_DATA for the write command WR_CMD to the memory device 110.

For this purpose, the memory controller 120 may divide the data WR_DATA for the write command WR_CMD into a plurality of segments and then perform the data input for the write command WR_CMD in units of segments. This is described in detail with reference to FIG. 12 below.

Figure 12:
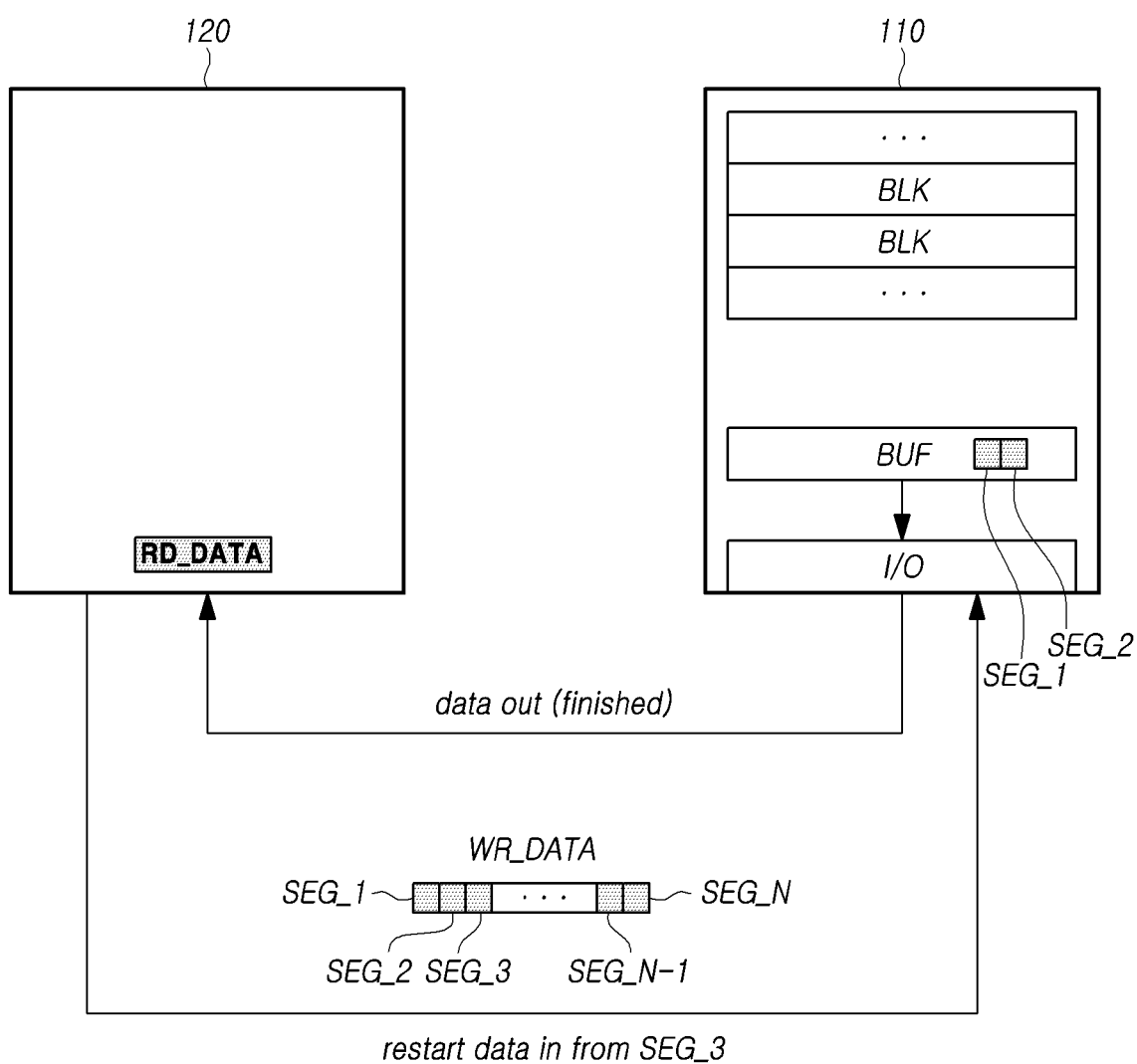
FIG. 12 is a diagram illustrating an operation in which a memory controller performs data input for the write command WR_CMD in units of segments in accordance with an embodiment of the present disclosure.

FIG. 12 is a diagram illustrating an operation in which the memory controller performs the data input for the write command WR_CMD in units of segments in accordance with an embodiment of the present disclosure.

Referring to FIG. 12, the memory device 110 may finish the operation of outputting the data RD_DATA for the read command RD_CMD to the memory controller 120.

When the memory device 110 finishes the operation of outputting the data RD_DATA for the read command RD_CMD, the memory controller 120 resumes the previously suspended data input for the write command WR_CMD.

As mentioned above, the memory controller 120 may divide the data WR_DATA for the write command WR_CMD into N segments, e.g., NG_1, SEG_2, SEG_3 to SEG_N−1, and SEG_N. In the illustrated embodiment, two segments, SEG_1 and SEG_2, of the N segments are stored in the buffer BUF.

In this case, the memory controller 120 may skip the data input for the segments SEG_1 and SEG_2, since such data input is already completed. The memory controller 120 may resume the data input for the remaining segments, i.e., SG_3 to SEG_N−1 and SEG_N here, which have not yet been inputted to the memory device 110.

The memory system 100 and the memory device 110 according to embodiments are described above with reference to FIGS. 5 to 12.

The operation of the memory system 100 according to embodiments is described below with reference to FIG. 13.

Figure 13:
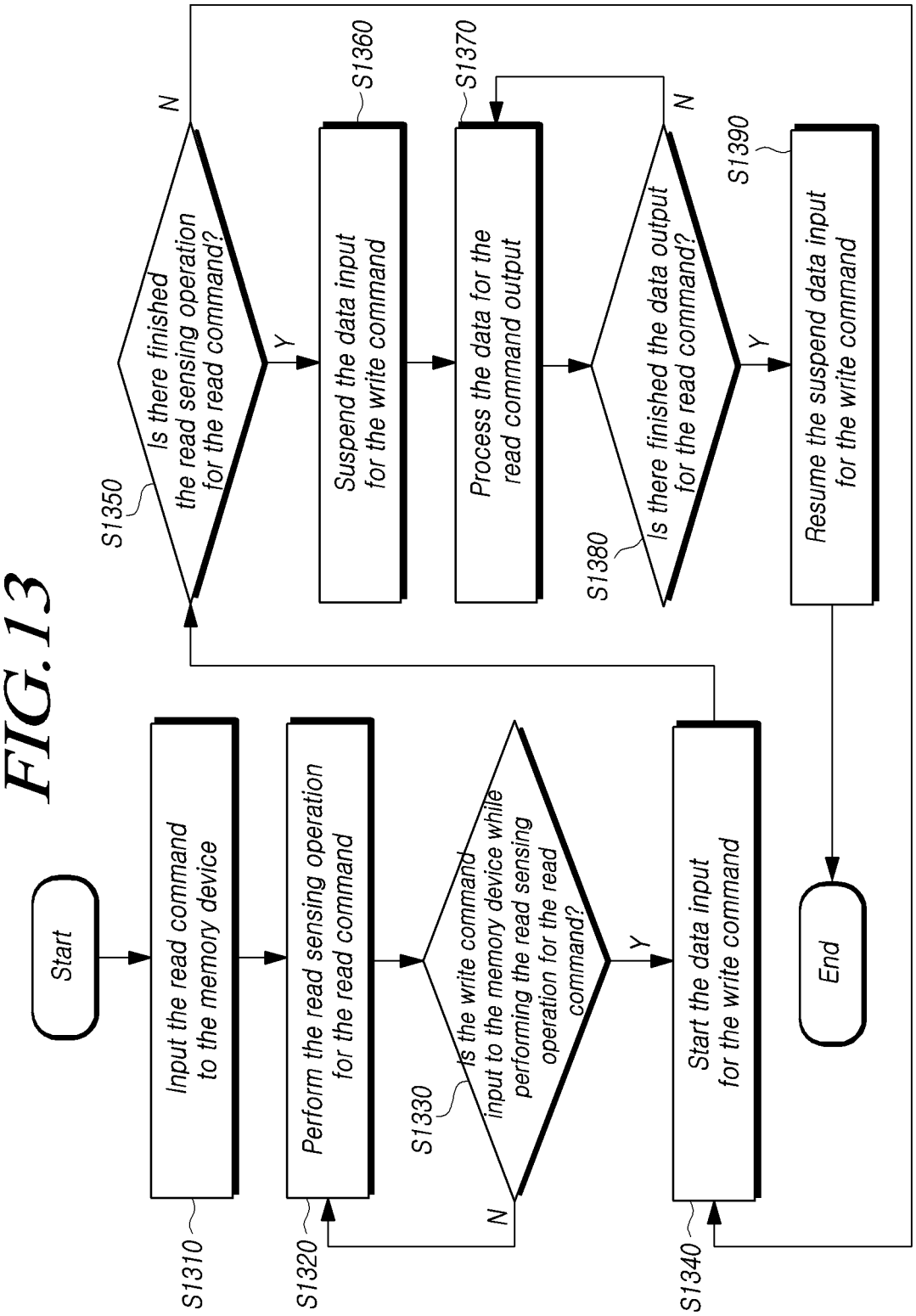
FIG. 13 is a flowchart illustrating an operation of a memory system in accordance with an embodiment of the present disclosure.

FIG. 13 is a flowchart illustrating an operation of the memory system in accordance with an embodiment of the present disclosure.

Referring to FIG. 13, the memory controller 120 of the memory system 100 may input the read command to the memory device 110 of the memory system 100 at S1310.

When the read command is input from the memory controller 120, the memory device 110 may perform the read sensing operation for the read command at S1320.

The memory device 110 determines whether the write command has been input to the memory device 110 while performing the read sensing operation for the read command at S1330.

If it is determined that the write command has been input to the memory device 110 at S1330, the memory controller 120 may start the data input for the write command at S1340. If it is determined that the write command has not been input to the memory device 110 at S1330, the memory device 110 continues performing the read sensing operation for the read command at S1320.

The memory device 110 determines whether the read sensing operation for the read command is finished at S1350.

If it is determined at S1350 that the read sensing operation for the read command is finished, the memory controller 120 may suspend the data input for the write command at S1360. If it is determined at S1350 that the read sensing operation for the read command is not finished, the memory controller 120 may continue performing the data input for the write command at S1340.

After suspending inputting of the data for the write command, the memory controller 120 may process the data for the read command output from the memory device 110 at S1370.

The memory controller 120 determines whether the memory device 110 has finished outputting the data for the read command at S1380. If the memory device 110 has not finished the data output for the read command, the memory device 110 keeps the data output for the read command.

If the memory device 110 finishes the data output for the read command, the memory controller 120 may resume the suspended data input for the write command S1390.

Figure 14:
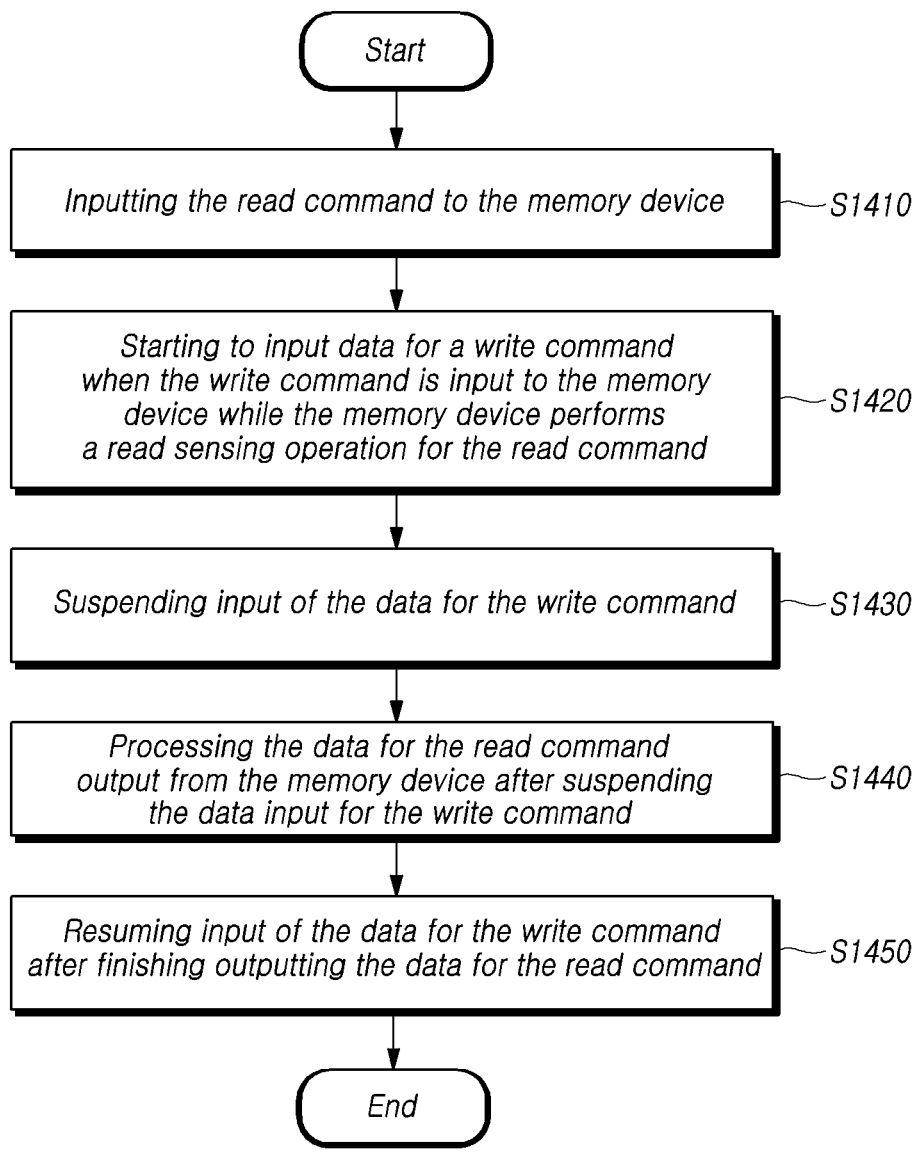
FIG. 14 is a flowchart illustrating a method of operating a memory system in accordance with an embodiment of the present disclosure.

FIG. 14 is a flowchart illustrating a method of operating a memory system in accordance with an embodiment of the present disclosure.

Referring to FIG. 14, the method 1400 of operating the memory system 100 in accordance with embodiments of the present disclosure includes inputting a read command to the memory device 110 by the memory controller 120 at S1410.

The method 1400 of operating the memory system 100 includes starting, by the memory controller 120, the data input for the write command when the write command is input to the memory device while the memory device 110 performs the read sensing operation for the read command at S1420.

The method 1400 of operating the memory system 100 may further include suspending, by the memory controller 120, the data input for the write command at S1430 when the read sensing operation for the read command is finished.

The method 1400 of operating the memory system 100 may further include processing, by the memory controller 120, the data for the read command output from the memory device at S1440 after the memory controller 120 suspends the data input for the write command.

The method 1400 of operating the memory system 100 may further include resuming, by the memory controller 120, the data input for the write command at S1450 after the memory device finishes the data output for the read command.

The operation of the memory controller 120 described above may be controlled by the control circuit 123, or performed in a manner in which the processor 124 executes firmware in which various operations of the memory controller 120 are programmed.

Figure 15:
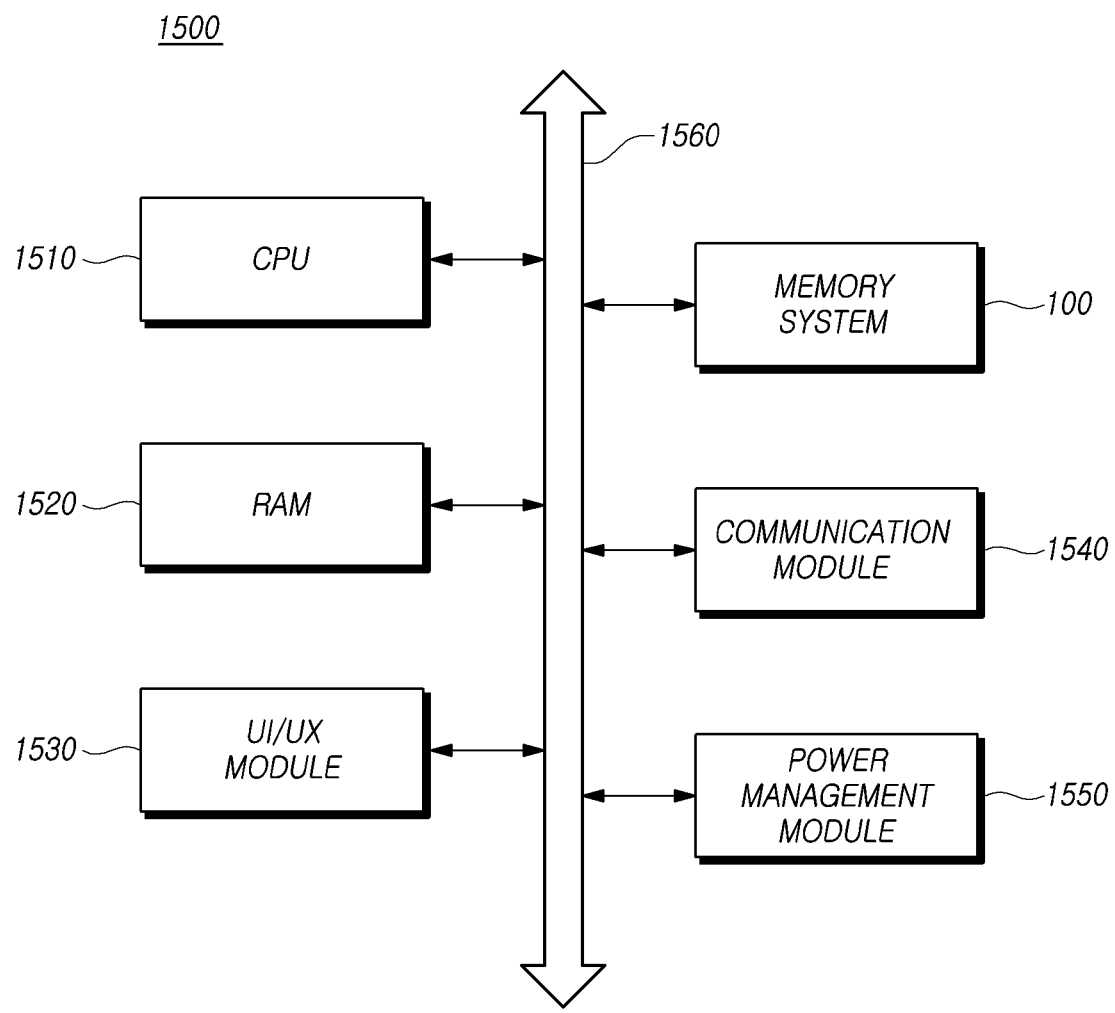
FIG. 15 is a diagram illustrating a configuration of a computing system in accordance with an embodiment of the disclosure.

FIG. 15 is a diagram illustrating a configuration of a computing system 1500 in accordance with an embodiment of the disclosure.

Referring to FIG. 15, the computing system 1500 may include a memory system 100, a central processing unit (CPU) 1510 for controlling general operations of the computing system 1500, a RAM 1520 for storing data and information related with operations of the computing system 1500, a UI/UX (user interface/user experience) module 1530 for providing use environment to a user, a communication module 1540 for communicating with an external device in a wired and/or wireless manner and a power management module 1550 for managing power used by the computing system 1500, which are electrically coupled to a system bus 1560.

The computing system 1500 may include a PC (personal computer), a mobile terminal such as a smartphone and a tablet or any of various other electronic devices.

The computing system 1500 may further include a battery for supplying an operating voltage, and may further include an application chipset, a graphic-related module, a camera image processor (CIS), a DRAM and so forth. Of course, the computing system 1500 may include other components.

The memory system 100 may include a device which stores data in a magnetic disk, such as a hard disk drive (HDD), and/or a device which stores data in a nonvolatile memory, such as a solid state drive (SDD), a universal flash storage (UFS) device and/or an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be realized as any of various types of storage devices, and may be mounted or embodied in any of various electronic devices.

Although various embodiments of the disclosure have been illustrated and described, those skilled in the art will appreciate that various modifications, additions and substitutions are possible, without departing from the scope and spirit of the disclosure. Therefore, the disclosed embodiments should be considered in a descriptive sense only and not for limiting the invention. The invention should be interpreted by the appended claims and encompass all equivalents falling within the scope of the appended claims.

What is claimed is:

1. A memory system comprising:
a memory device; and
a memory controller configured to control the memory device,
wherein the memory controller is further configured to:
input a read command to the memory device,
start to input data for a write command when the write command is input to the memory device, wherein the memory device performs a read sensing operation for the read command simultaneously with the input of the data for the write command, and
input, to the memory device, data for the write command when input of the write command is started.

2. The memory system according to claim 1, wherein the memory controller suspends the data input for the write command, which is in progress, when the read sensing operation for the read command is finished.

3. The memory system according to claim 1, wherein the memory controller processes data for the read command output from the memory device after suspending the data input for the write command.

4. The memory system according to claim 3, wherein the memory controller resumes the data input for the write command after the memory device finishes output of the data for the read command.

5. The memory system according to claim 4, wherein the memory controller divides data for the write command into a plurality of segments.

6. A memory device comprising:
a buffer configured to store data input from a memory controller and data to be output to the memory controller,
wherein data input for a write command is performed when the write command is input from the memory controller, wherein performing a read sensing operation for a read command input from the memory controller occurs simultaneously with the input of the data for the write command, and
wherein data for the write command is input to the buffer when input of the write command is started.

7. The memory device according to claim 6, wherein input of data for the write command is suspended when the read sensing operation for the read command is finished.

8. The memory device according to claim 7, wherein the memory device processes the data output for the read command after suspending the input of data for the write command, and outputs the data for the read command from the buffer.

9. The memory device according to claim 8, wherein input of data for the write command is resumed after the data output for the read command is finished.

10. A method for operating a memory system comprising a memory device and a memory controller configured to control the memory device, the method comprising:
inputting, by the memory controller, a read command to the memory device; and
starting, by the memory controller, to input data for a write command when the write command is input to the memory device, wherein the memory device performs a read sensing operation for the read command simultaneously with the input of the data for the write command,
wherein data for the write command is input to the memory device when input of the write command is started.

11. The method for operating the memory system according to claim 10, further comprising: suspending input of the data for the write command when the read sensing operation for the read command is finished.

12. The method for operating the memory system according to claim 11, further comprising: processing the data for the read command output from the memory device after suspending the data input for the write command.

13. The method for operating the memory system according to claim 12, further comprising: resuming input of the data for the write command after the memory device finishes outputting the data for the read command.

* * * * *